United States Patent [19]

Stifter

[11] Patent Number: 4,553,039
[45] Date of Patent: Nov. 12, 1985

[54] UNINTERRUPTIBLE POWER SUPPLY

[76] Inventor: Francis J. Stifter, 171 S. Main St., Natick, Mass. 01760

[21] Appl. No.: 548,517

[22] Filed: Nov. 3, 1983

[51] Int. Cl.$^4$ .................... H02M 7/537; H02V 9/00
[52] U.S. Cl. ........................................ 307/66; 307/64; 363/41; 363/134
[58] Field of Search .................... 307/43–46, 307/48, 64, 66, 85–87; 363/133, 134, 97, 24, 25, 41

[56] References Cited

U.S. PATENT DOCUMENTS

| | | | |
|---|---|---|---|
| 4,155,113 | 5/1979 | Simmons | 363/134 X |
| 4,336,587 | 6/1982 | Boettcher, Jr. et al. | 363/24 X |
| 4,401,895 | 8/1983 | Petkovsek | 307/66 |
| 4,489,371 | 12/1984 | Kernick | 363/41 |

Primary Examiner—A. D. Pellinen
Assistant Examiner—T. DeBoer
Attorney, Agent, or Firm—John E. Toupal; Harold G. Jarcho

[57] ABSTRACT

A variable voltage power supply including a power source connected to an electrical energy storage means by an electronic switching means. Coupled to the energy storage means is a voltage output circuit providing an output voltage for a load and electrical energy transfer thereto from the energy storage means. A voltage comparator compares the output voltage with a periodically varying reference voltage providing output signals that switch the electronic switching means to cause the output voltage to track the reference voltage.

21 Claims, 8 Drawing Figures

UNINTERRUPTIBLE POWER SUPPLY

BACKGROUND OF THE INVENTION

This invention relates generally to power supplies, and more particularly, to switching uninterruptible power supplies.

Continuous enerigization is a requirement of many types of electrical and electronic apparatus. Well known examples of continuous energization dependent apparatus include computers and medical equipment. Even extremely brief interruptions of power to such equipment can cause serious if not calamitous difficulties. To alleviate problems associated with power interruption, there have been developed various systems for producing emergency power in the event of the failure of a principle power source. Generally such systems are identified as either uninterruptible or standby power supplies.

Standby systems utilize battery operated auxiliary power supplies that function only when a principle power supply fails. Typically, a charging system is provided to maintain a full charge on the battery of the auxiliary supply. In response to the output of a sensor, the auxiliary supply is coupled to a load after a detected failure of a primary power source. Although standby supplies are relatively simple and low cost, the required switchover from primary to auxiliary supply often produces interruptions in the continuity of power flow. For many types of equipment such interruptions in continuity are unacceptable.

In uninterruptible supply systems, a load is supplied directly through an auxiliary supply which can comprise an inverter powered by a battery. A primary power supply constantly charges the battery through a rectifier that typically supplies power to the inverter for energizing the load. Upon a failure of the primary supply, power continues to flow from the battery into the inverter. Thus, no interruption of power is experienced by the load unless the failure of the primary supply extends beyond the charge life of the battery. Although prior uninterruptible power supplies perform reasonably well, they do exhibit certain deficiencies. For example, known uninterruptible supplies are relatively expensive in that the rectifier employed by the system must be large enough to supply all power needed by the load under all circumstances and additionally because the continuously functioning auxiliary supplies must exhibit high reliability and durability. Relatively low power transmission efficiency is still another drawback of many existing uninterruptible supplies.

The object of this invention, therefore, is to provide an improved uninterruptible power supply that is highly reliable, efficient and relatively inexpensive.

SUMMARY OF THE INVENTION

The invention is a variable voltage power supply including a power source connected to an electrical energy storage means by an electronic switching means. Coupled to the energy source means is a voltage output circuit providing an output voltage for a load and electrical energy transfer thereto from the power source. A voltage comparator compares the output voltage with a periodically varying reference voltage providing output signals that switch the electronic switching means to cause the output voltage to track the reference voltage. Energy stored by the energy storage means limits the change in the output voltage during on periods of the switching means. By suitably selecting a reference voltage, the power supply can provide a variable output voltage of any desired form.

According to a preferred embodiment of the invention, the reference source comprises an AC source and rectifier means for producing from alternate half cycles thereof, respectively, first and second reference waveforms. The electrical energy storage means comprises first and second storage means, the electronic switching means comprises first switching means connecting the power source to the first storage means and second switching means connecting the power source to the second storage means, the output means comprises a transformer winding and the comparator means comprises a first comparator for comparing the first reference waveform with the voltage at one end of the winding and a second comparator for comparing the second waveform with the voltage at an opposite end of the winding. Operative coupling between the first comparator and the first switching means produces switching thereof that causes the output voltage to track the first waveform and operative coupling between the second comparator and the second switching means provides switching thereof that causes the output voltage to track the second waveform. By splitting the AC reference into first and second opposite half cycle waveforms and utilizing those reference waveforms to provide push-pull operation of a pair of duplicate switching circuits, a power supply voltage corresponding to the AC reference voltage is produced across the output transformer winding.

According to one feature of the invention, filter circuits are provided for filtering the output voltage. The filter circuits provide a smoother output voltage from the highfrequency switching circuits.

According to another feature of the invention the power source comprises an AC supply and the system includes a battery connected to alternatively receive or supply energy to the first and second electrical energy storage means. The battery functions to maintain output voltage during periods in which interruptions occur in the AC supply.

According to still other features of the invention, the AC source comprises a sine wave generator and the rectifier comprises a split rectifier. The use of a sine wave generator and split rectifier produces in an efficient manner a corresponding sine wave output voltage that is required by most electrical equipment.

According to yet another feature of the invention, the reference source further comprises a phase lock circuit for locking the phase of the sine wave generator to that of the AC supply. Locking the phase of the sine wave generator to that of the AC supply ensures continuity in the output voltage in the event of an interruption in the AC supply.

According to a further feature of the invention, the power source comprises a voltage regulator coupled between the AC supply and the first and second energy storage means. The voltage regulator provides power under normal conditions for operating the switching circuits.

According to yet another feature of the invention the electrical energy storage means comprise inductors and the sytem includes a diode connected between each inductor and the power source The diodes conduct current only in response to a threshold voltage level produced by a collapsing magnetic field in the associated inductor caused by opening of its switching means. The inductors and diodes ensure continuous current flow through the output transformer winding and the diodes return energy stored in the inductors to the power source.

According to still other features of the invention, the comparators are operational amplifiers and the switching means are transistor pairs operated in a push-pull relationship by the comparators in response to the alternate half cycle reference waveforms. The transistor pairs and operational amplifiers provide an efficient arrangement for producing the desired continuous sine wave output voltage.

DESCRIPTION OF THE DRAWINGS

These and other objects and features of the invention will become more apparent upon a perusal of the following description taken in conjunction with the accompanying drawings wherein.

DESCRIPTION OF THE PREFERRED EMBODIMENT

Figure 1:
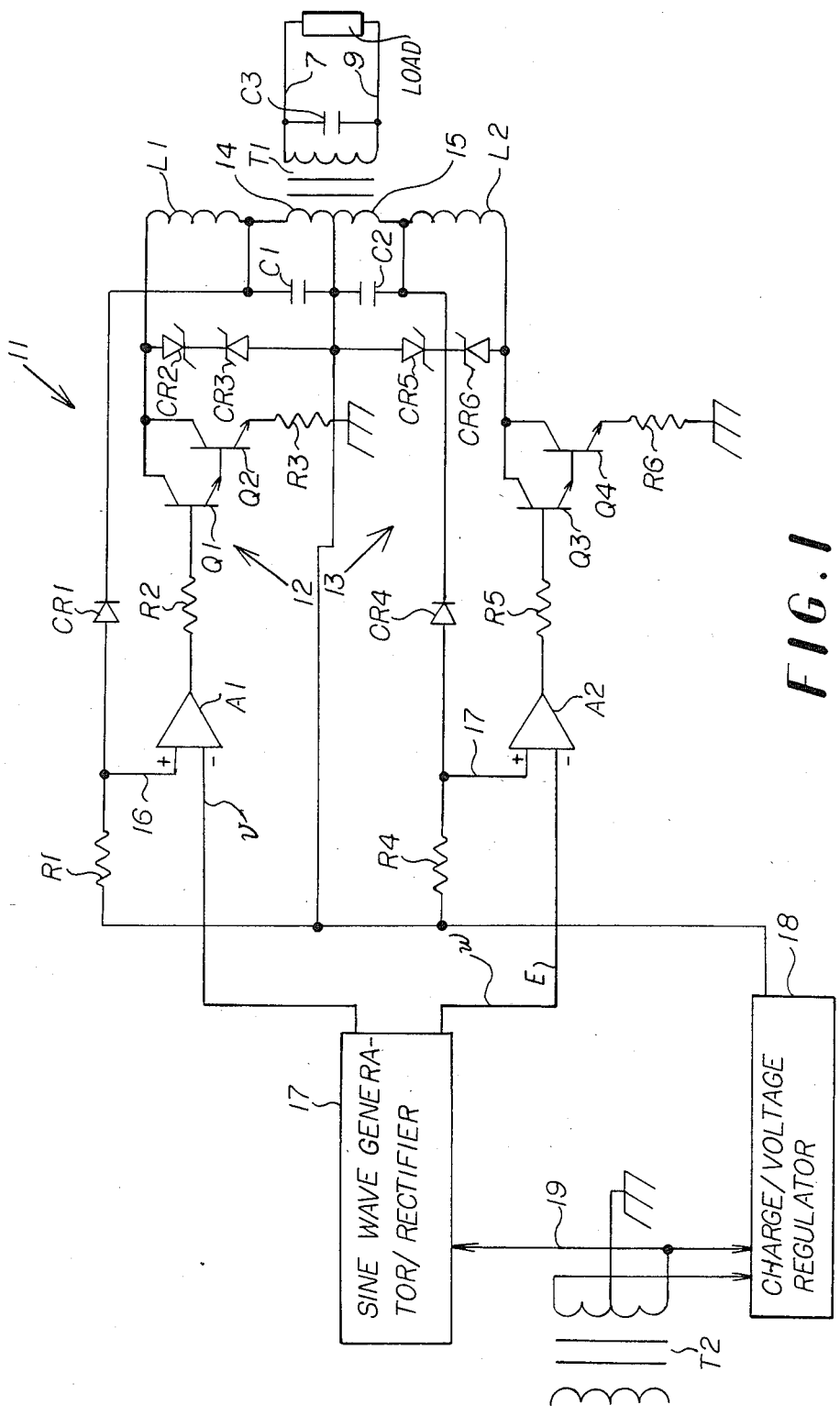
FIG. 1 is a schematic circuit diagram of an uninterruptible power supply according to the invention.

Illustrated in FIG. 1 is a switching circuit 11 that provides on lines 7, 9 an AC output for connection to a suitable load (not shown). Included in the switching circuit 11 are identical first and second switching circuits 12, 13 that produce, respectively, predetermined current waveforms in output primary windings 14, 15 of a transformer T1. The first switching circuit 12 includes an operational amplifier A1 that receives a detected output voltage on one input 16 and on another input v a half cycle reference sine wave produced by a sine wave generator/rectifier 17. Receiving the output of the amplifier A1 via a resistor R2 is a transistor pair Q1, Q2 that controls current flow through an electrical energy storage inductor L1 and the primary winding 14. Additional electrical energy storage is provided by a capacitor C1 which also filters the output produced across the winding 14. Connected across the inductor L1 and the output winding 14 are a pair of oppositely connected free-wheeling zener diodes CR2, CR3. The identical second switching circuit 13 also includes an operational amplifier A2 that receives a detected output voltage on one input 17 and on an input w an opposite half cycle sine wave from the generator/rectifier 17. The output of the amplifier A2 is applied through a resistor R5 to a pair of transistors Q3, Q4 that control current flow through an inductor L2 and the output transformer winding 15. Again, the output across the winding 15 is filtered by a capacitor C2 and a pair of oppositely connected zener diodes C5, C6 are connected across the winding 15 and the inductor L2. A regulated voltage input E for the switching circuit 11 is provided by a charge/voltage regulator 18 that receives power from the secondary of a transformer T2 having a primary winding connected to a suitable AC supply. The secondary of the transformer T2 also provides on a signal line 19 a phase lock signal to the sine wave/rectifier 17. A more detailed operational description of the switching circuit 11 will be given hereinafter.

Figure 2:
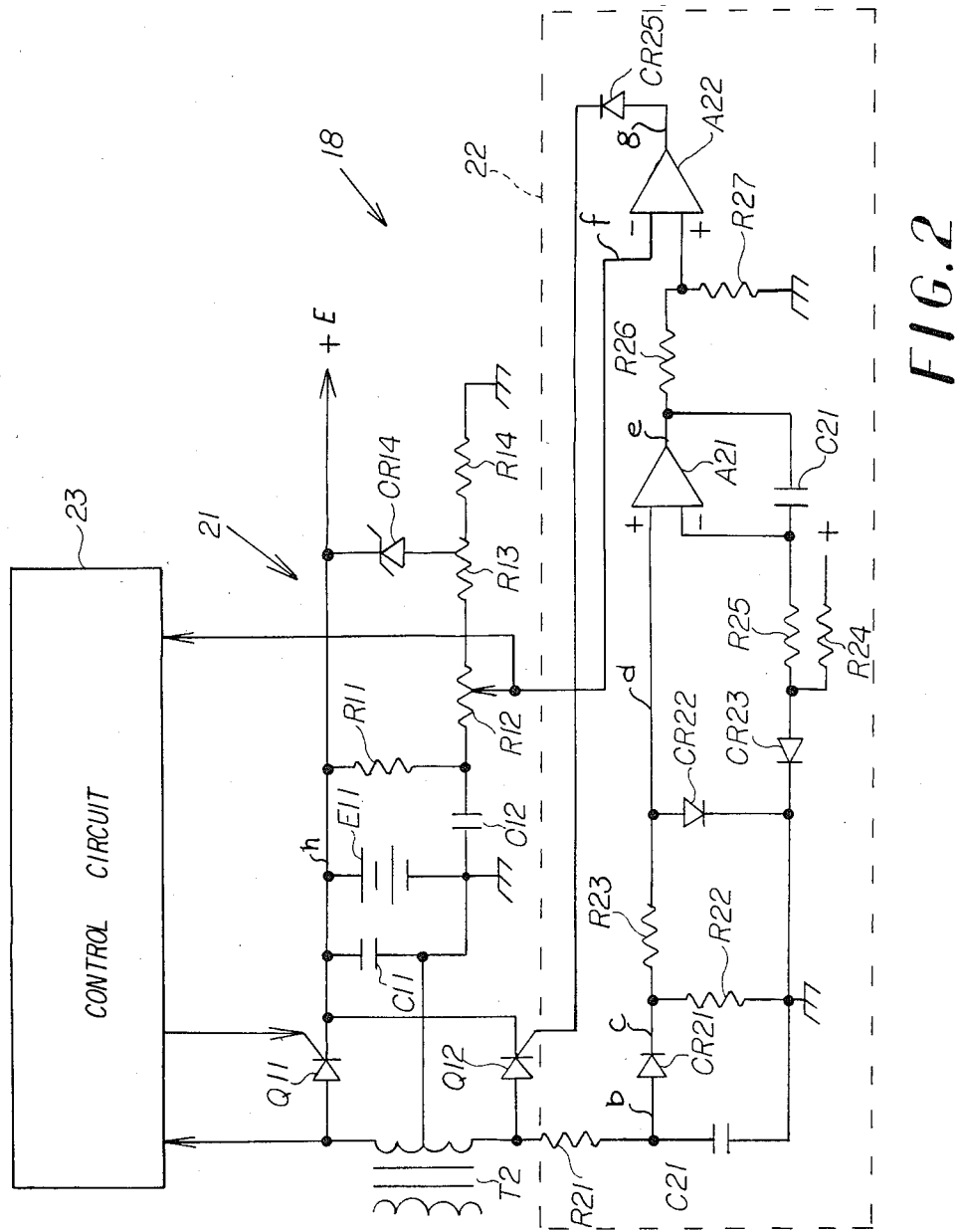
FIG. 2 is a detailed schematic circuit diagram of a chargevoltage regulator block shown in FIG. 1.

FIG. 2 illustrates in greater detail the charge/voltage regulator 18 shown in FIG. 1. The transformer T2 supplies power to a regulating voltage output circuit 21 including a battery 11; capacitors C11, C12; resistors R11–R14; and a diode CR14. As described more fully below, the voltage output of the circuit 21 is regulated by a pair of SCRs Q11, Q12. Controlling the Q12 is a control circuit 22 including resistors R21–R27; a capacitor C21; diodes CR21–CR23 and CR25; and a pair of operational amplifiers A21, A22. The Q11 is similarly controlled by an identical control circuit 23.

Figure 3:
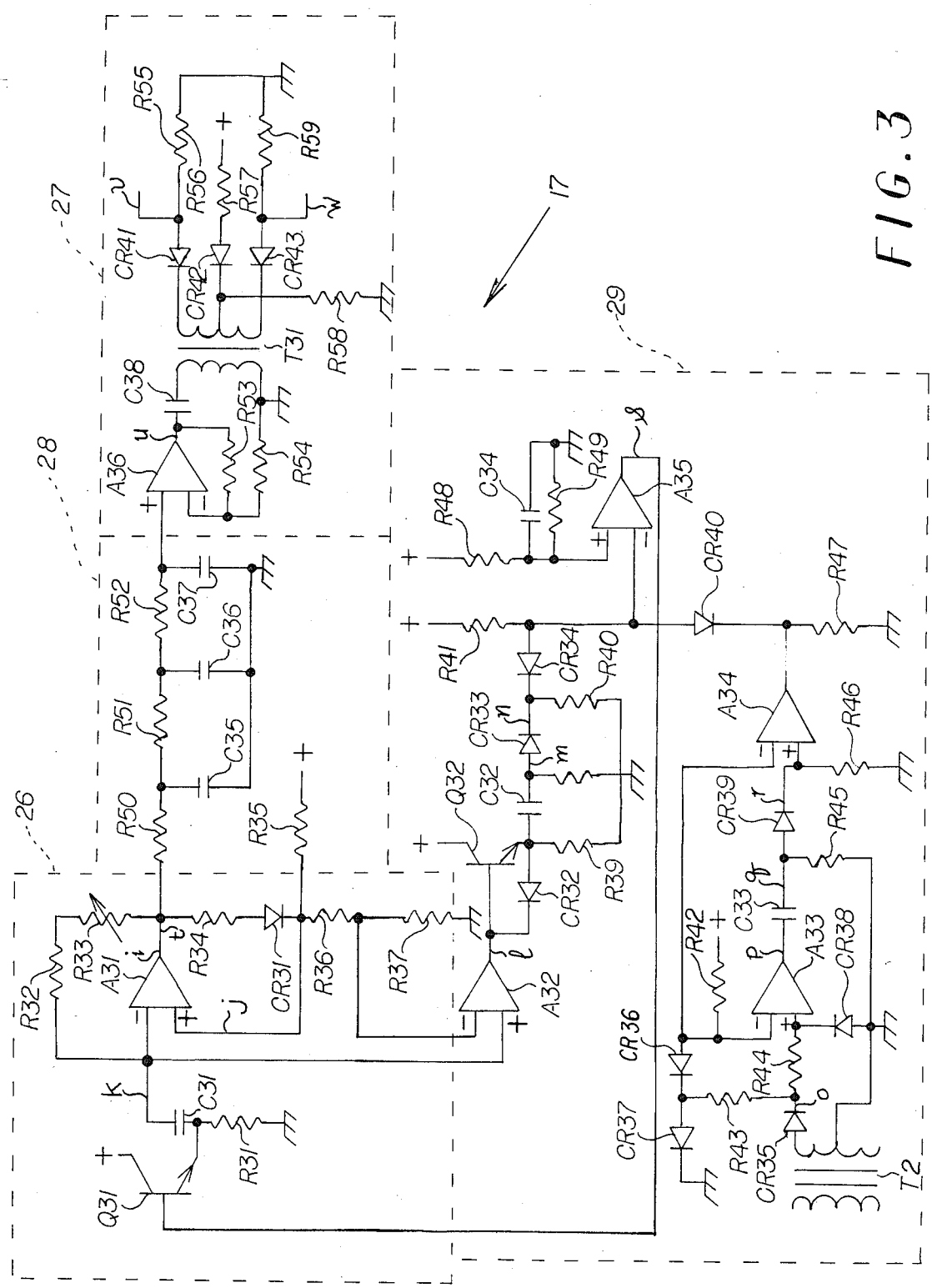
FIG. 3 is a detailed schematic circuit diagram of a sine wave generator block shown in FIG. 1.

FIG. 3 shows in greater detail the sine wave generator/rectifier 17 shown in FIG. 1. Included in the generator circuit 17 is a free running oscillator 26 that supplies a split rectifier 27 through a filter circuit 28. The oscillator 26 includes resistors R32–R35; an operational amplifier A31; and a diode CR31. Composing the filter circuit are resistors R50–R52 and capacitors C35–C37. The split rectifier 27 includes a transformer T31; an operational amplifier A36; resistors R53–R59; a capacitor C38; and diodes C41–C43. Also included in the sine wave generator/rectifier circuit 17 is a crossover phase lock circuit 29 that includes operational amplifiers A32–A35; resistors R31 and R41–R48; capacitors C32–C34; diodes CR32–CR40, and a transistor Q31.

OPERATION

Figure 5:
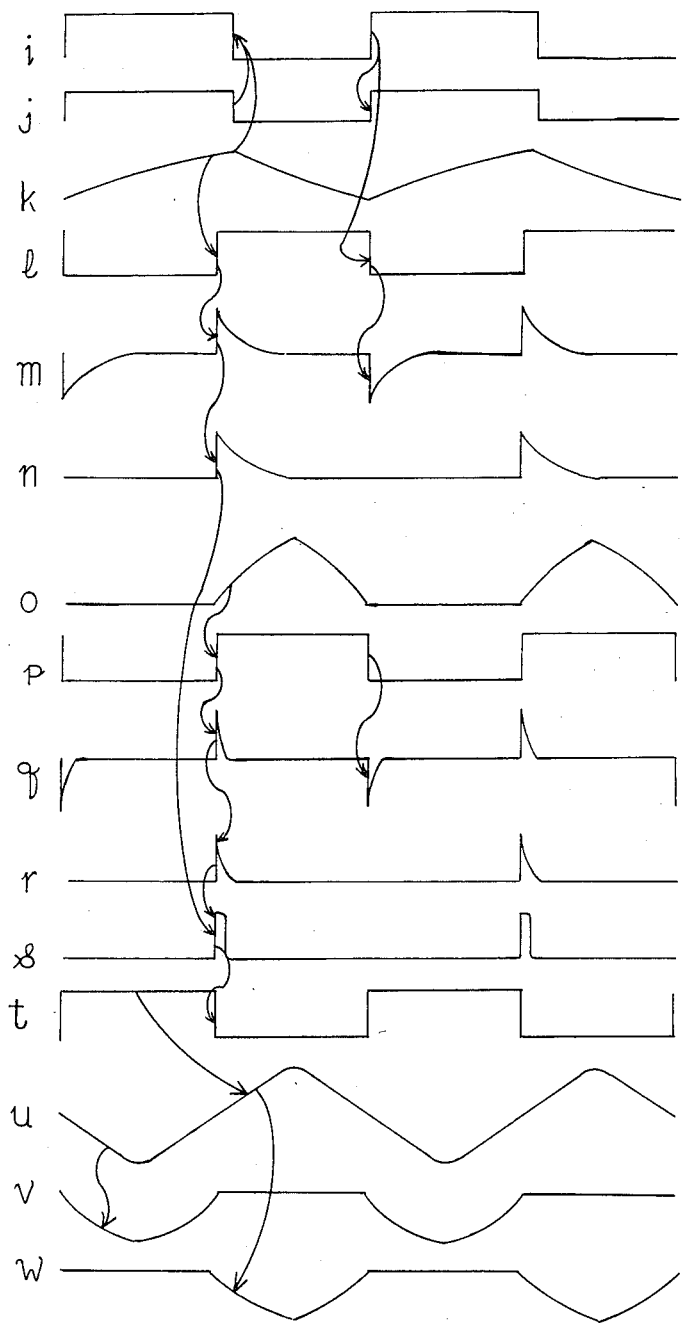
FIG. 5 is a schematic diagram illustrating various voltage waveforms produced in the circuits shown in FIGS. 1 and 3.

As described below a sine wave is generated with the generator/rectifier 17 of FIG. 1 and a split rectifier therein separates the sine wave into two negative half cycle waveforms which function as reference voltages for the comparators A1 and A2. Assume that a negative half wave (waveform v in FIG. 5) is present at the input of the comparator amplifier A1. At the beginning of the waveform the input (−) is more negative than the (+) input at 16 resulting in amplifier A1 output going high. The transistors Q1 and Q2 are switched "on", going into saturation and drawing current through the inductor L1. This reduces the voltage across the capacitor C1 and the transformer winding 14. When the voltage at the capacitor C1 is reduced such that the (+) amplifier input at 16 is more negative than the waveform input v the transistors Q1 and Q2 are switched "off". Rapid change of current in the inductor L1 current results in an "inductive kick" which is snubbed by the zener diodes CR2 and CR3. Since the waveform v is continuing in a negative direction, the (−) amplifier input will quickly become more negative than the (+) input and transistors Q1, Q2 will again be switched "on" to further reduce the voltage across the capacitor C1. This alternate switching action will occur many times during the negative half cycle, developing a voltage across the transformer winding 14 that closely tracks the reference waveform v. During the next half cycle, the waveform w, FIG. 5, is impressed on the (−) input of the comparator amplifier A2 similarly switching the transistors Q3, Q4. Accordingly, the voltage across the capacitor C4 is made to follow the waveform w, developing a tracking voltage across the transformer winding 15. These alternating sine wave half cycles developed, respectively, across the windings 14, 15 combine to form a full sine wave output for the transformer T1.

Figure 4:
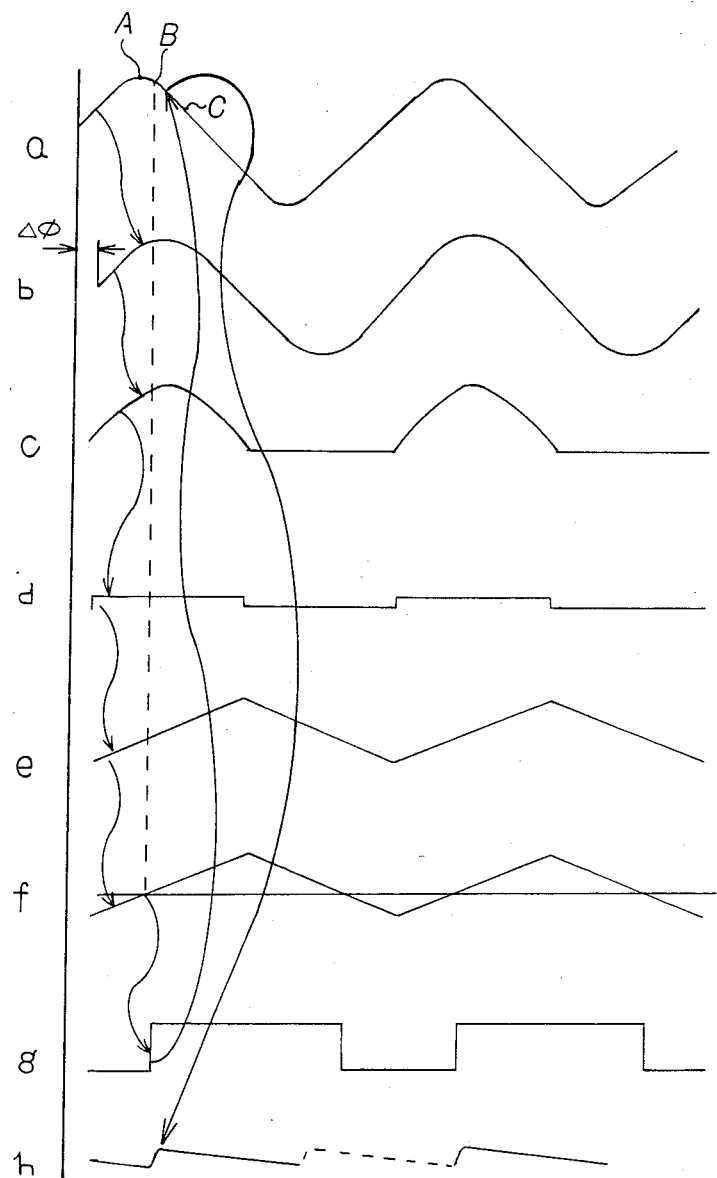
FIG. 4 is a schematic diagram illustrating various waveforms generated in the charge-voltage regulator shown in FIG. 2.

Power for basic uninterruptible operation of the circuit 11 is drawn from the battery E11 in the charge/voltage regulator 18 (FIG. 2) which is provided to accommodate a wide range of commercial line voltages. Waveforms depicting operation of the charge/voltage regulator are shown in FIG. 4. Secondary voltage a from the Transformer T2 is phase shifted by the RC network R21, C21 as shown in the waveform b. This phase shifted voltage is rectifed by the diode CR21 as shown by the waveform c. The resistor R23 couples the rectified waveform c to the clipper diode CR22 and the (+) input of the integrator amplifier A21. The waveform d depicts the clipped voltage. Output of the amplifier A21 is an integrated waveform e and is applied to the (+) input of the comparator amplifier A22. An adjustable voltage for the (−) input to the comparator A22 is derived from the battery E11 and the capacitor C11. Waveform f shows these two inputs to the comparator A22. When the integrated voltage at (+) input of the comparator 22 exceeds the (−) input its output goes high. That high output functions as an SCR gate, which is coupled to the SCR Q12 causing it to trigger into conduction. The SCR gate is shown as the waveform g in FIG. 4. The point B on the waveform a is shown as the point at which conduction of the SCR Q12 is initiated. A lower battery voltage, whether due to increased load or lower line voltage, will cause earlier conduction (toward point A on waveform a) tending toward maintenance of system operating voltage and battery charge. Conversely, higher battery voltage, whether due to decreased load or higher line voltage, will cause later conduction (toward point C on waveform a), again maintaining system operating voltage and battery charge at desirable levels. The waveform h depicts the battery, E11, voltage showing the increased voltage level at the point of conduction of the SCR Q12. Also shown in dotted lines is the voltage that would result from the other half 23 of the charge/voltage regulator 18 when the SCR Q11 conducts. The zener diode CR14 and the potentiometer R13 permit adjustment for an upper voltage limit to protect the battery E11 and the sytem from excessive line voltage.

As shown in FIG. 3, the operational amplifier A31, together with the diode CR31 and the resistors R32–R37 comprise a basic square wave oscillator 26. The frequency of oscillation is set by the variable resistor R33. Depicted in FIG. 5 is the basic oscillator waveform i. Assume first that the output of the amplifier A31 has just switched high. The voltage at the (+) input of the amplifier A31 increases and the capacitor C31 charges through the resistors R32 and R33 as shown by waveform k in FIG. 5. Voltage divider R36, R37 sets up a voltage at the (−) input of the amplifier A32 that is slightly lower than the (+) input of the amplifier A31. The output of the amplifier A32 then is low. When the capacitor C31 charge just exceeds the voltage at the (−) input of amplifier A32, the output of the amplifier A32 goes high as shown by the waveform l. Shortly after the output of the amplifier A32 goes high, the increasing voltage on the capacitor C31 exceeds the voltage on the (+) input of amplifier A31 causing the output of amplifier A31 to go low as shown by the waveforms i and k. When the output of amplifier A31 goes low its (+) input switches to a lower voltage set up by the voltage divider R35–R37 and the capacitor C31 begins to discharge through the resistors R32, R33 as shown by waveforms j and k. The capacitor C31 continues discharging until the (−) input of amplifier A31 becomes lower than its (+) input at which point its output goes high. Simultaneously, the output of the amplifier A32 goes low as shown by waveforms i and l. The waveform l always goes high slightly before the A31 oscillator output goes low and is differentiated by resistor R39 and capacitor C32 and unipolarized by the diode CR33 to create an early transition pulse shown by the waveforms m and n.

Up to this point, the oscillator 26 has been free running, with the period of oscillation determined by the capacitor C31, the resistors R32, R33 and the varying voltage on the (+) input of the amplifier A31. To achieve phase lock to 60 Hertz commercial power, a smooth transition between the free running state and locked operation occurs to avoid a disruptive oscillator output. Application of commercial AC power can occur anytime during the cycle generated by free-running oscillator 26. The waveforms o, p, q and r derived from the commercial power waveform, occur regardless of the phase relationship between the commercial power and the free running oscillator 26. When the free running oscillator 26 drifts to within a few degrees of the commercial power, the early transition pulse (waveform n) derived from the oscillator, and the Cross-over Pulse (waveform r) derived from commercial power, combine in an "and" gate producing a Sync Pulse (waveform s) locking the oscillator 26 to the commercial power as depicted by the waveform t. Phase lock insures that the transformer T2 and the charge/voltage regulator 18 will supply power in phase with maximum energy drawn by the supply 11. Thus, AC current through the capacitor C11 is reduced providing higher efficiency and greater reliability. In addition, any load operating in synchronism with the AC power line is not subjected to frequency "slippage" that can cause speed locking errors in motor drives and eye strain producing flicker in display terminals.

In explanation of the above series of events, first consider the waveforms o through r. The diode CR35 (FIG. 3) provides half wave rectification of the commercial power. This rectified half cycle is converted to a square wave by the op amplifier A33 and differentiated by the RC network R45, C33. The diode CR39 removes the negative excursion of the differentiator network. Receiving the positive pulse corresponding to the cross-over point of the commercial power waveform (waveform r) and delivering a pulse out to the "and" gate formed by the resistors R41, R47, the diode CR34 and the diode CR40 is the op amplifier A34. Only when an Early Transition Pulse at the cathode of the diode CR34 (waveform n) coincides with the 60 Hertz Cross-over Pulse at the cathode of the diode 40 (waveform r) does an output occur from the "and" gate. That output activates the amplifier A35 which delivers a Sync Pulse (waveform s) through the transistor Q31 to "lock" a oscillator 26 as shown in waveform t. A three stage RC filter R50–52, C35–37 removes harmonics from the square wave and after amplification by the amplifier A36 a sine wave of waveform u is obtained. The amplifier A36 applies the sine wave u to the transformer T31 and the split rectifiers CR41 and CR43 generate the waveform v and w of FIG. 5. These negative half cycle waveforms v and w are returned to the supply E through the diode CR42 and the resistor R57 and are utilized to drive the switching network 11 of FIG. 1.

Figure 6A:
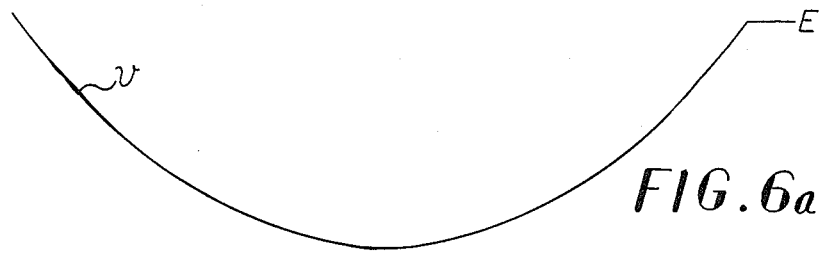
FIGS. 6a–6c are schematic diagrams illustrating other waveforms produced in the circuit shown in FIG. 1.
Figure 6B:
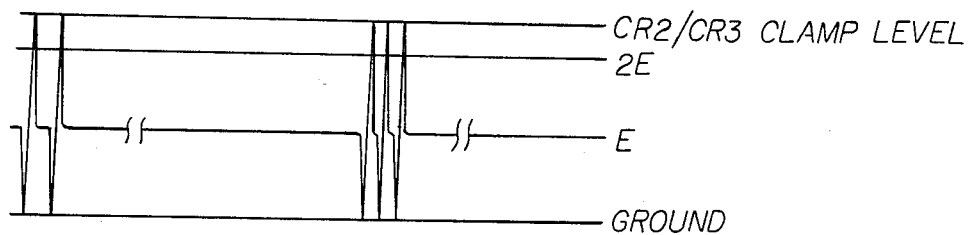
Figure 6C:
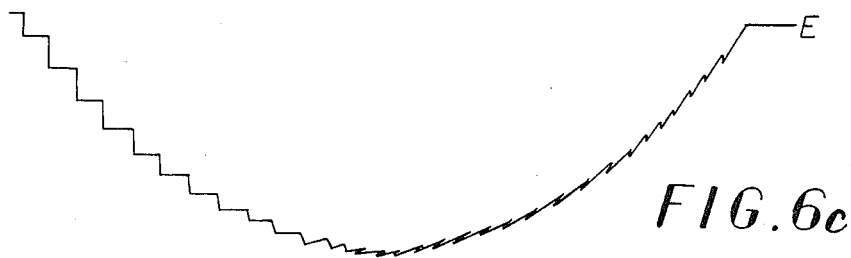

To more fully explain the operation of the switching transistor circuit 11 reference is now made to FIG. 1 and FIGS. 6a–6c. The comparator, A1 receives the reference input voltage v and the negative swing portion of the voltage present at the winding 14 of the transformer T1. As the comparator switches the transistor pair Q1, Q2 "on", the transistor Q2 is driven into saturation as shown by the waveforms in FIG. 6b. During conduction of the transistor pair Q1, Q2 current is drawn through the inductive coil L1 and the output capacitor C1. The current induces in the inductive coil L1 a magnetic field representing stored electrical energy. In addition, the resultant induced voltage across the coil L1 meters current flow to thereby limit the change in output voltage across the capacitor C1. When the winding 14 of the transformer T1 is pulled lower than the reference voltage v, the transistor pair Q1–Q2 is switched "off", and the magnetic field of the inductive coil L1 collapses, releasing its stored energy as an inductive kick. Once the inductive kick voltage exceeds the break down (clamp level) voltage of the diodes CR; CR3, current resumes flowing through the coil L1 and stored energy is returned by the transfer diodes CR2, CR3 to the power supply E. Shortly thereafter the reference voltage u becomes more negative than the voltage at winding 14 of the transformer T1 and the transistor pair Q1–Q2 is again switched "on". This switching action slows down when a lighter load is present and speeds up for heavier loads, and may reach a 200 KHz rate. As shown in FIG. 6c, the voltage at the winding 14 of the transformer T1 has a switching frequency component. The capacitor C3 across the output of the transformer T1, serves to filter out the switching frequency energy.

Obviously, many modifications and variations of the present invention can be used to generate variable voltage waveforms other than full sine waves. Such other waveforms could be used, for example, to drive vibration analysis equipment, to power test equipment under adverse voltage conditions for frequency sweep testings of equipment to produce irregularly shaped harmonic stimulus for medical applications, for scientific experiments requiring harmonic non-sinusoid waveforms where even a momentary lapse of power could result in physical damage or costly interruptions, etc. Also, the invention can be easily modified to generate frequencies other than 60 Hertz. It is to be understood, therefore, that the invention can be practiced otherwise than as specifically described.

What is claimed is:

1. A variable voltage power supply comprising:
   power source means;
   voltage output means connectable between said power source means and a load, said voltage output means when connected to the load providing an AC output voltage therefor and electrical energy transfer between said power source and the load;
   electronic switching means comprising first and second switching means each coupled to said power source means and said voltage output means;
   reference source means comprising an AC source and means for producing from alternate half cycles thereof, respectively, first and second reference waveforms;
   voltage comparator means comprising first comparator means for comparing said first reference waveform with one phase of said AC output voltage and a second comparator means for comparing said second waveform with the opposite phase of said AC output voltage, said first comparator means being operatively coupled to said first switching means so as to produce switching thereof that causes said output voltage to track said first waveform and said second comparator means being operatively coupled to said second switching means so as to produce switching thereof that causes said output voltage to track said second waveform; and
   electrical energy storage means coupled to said voltage output means and storing energy provided by said source means during said switching of said first and second switching means.

2. A variable voltage power supply according to claim 1, wherein said electrical energy storage means comprises first and second storage means; said first switching means comprises first electronic switch means that during on periods is driven to saturation and said first storage means limits change in said output voltage, and said second switching means comprises second electronic switch means that during on periods is driven to saturation and said second storage means limits change in said output voltage.

3. A variable voltage power supply according to claim 2 wherein said power source comprises an AC supply, and including battery means connected to alternatively receive or supply energy to said first and second storage means.

4. A variable voltage power supply according to claim 3 wherein said AC source comprises a sine wave generator, and said means for producing said first and second waveforms comprises a split rectifier.

5. A variable voltage power supply according to claim 4 wherein said reference source means further comprises phase lock means for locking the phase of said sine wave generator to that of said AC supply.

6. A variable voltage power supply according to claim 5 wherein said power source means comprises voltage regulator means coupled between said AC supply and said first and second energy storage means.

7. A variable voltage power supply according to claim 2 wherein said first and second energy storage means comprise first and second inductance means.

8. A variable voltage power supply according to claim 7 including first and second transfer means, said first transfer means transferring energy stored by said first inductance means to said source means during off periods of said first switching means, and said second transfer means transferring energy stored by said second inductance means to said source means during off periods of said second switching means.

9. A variable voltage power supply according to claim 8 wherein said first transfer means comprises a first unidirectional conduction means connected between said first inductance means and said source means and adapted to conduct current only in response to a threshold voltage provided by a collapsing magnetic field in said first inductance means caused by opening of said field switching means, and a second unidirectional conduction means connected between said second inductance means and said source means and adapted to conduct current only in response to a threshold voltage provided by a collapsing magnetic field in said second inductance means caused by opening of said second switching means.

10. A variable voltage power supply according to claim 9 wherein said first and second conduction means comprise diode means.

11. A variable voltage power supply according to claim 10 wherein said first and second comparator means comprise operational amplifier means.

12. A variable voltage power supply according to claim 11 wherein said first and second switching means comprise transistor pairs operated in a push-pull relationship by said first and second comparator means in response to said first and second reference waveforms.

13. A variable voltage power supply according to claim 1 wherein said output means comprises a center-tapped transformer winding, said first comparator compares said first reference waveform with the voltage at one end of said winding, and said second comparator compares said second reference waveform with the voltage at an opposite end of said winding.

14. A variable voltage power supply according to claim 13 wherein said electrical energy storage means comprises first and second storage means; said first switching means comprises first electronic switch means that during on periods is driven to saturation and said first storage means limits change in said output voltage; and said second switching means comprises second electronic switch means that during on periods is driven to saturation and said second storage means limits change in said output voltage.

15. A variable voltage power supply according to claim 14 wherein said power source comprises an AC supply, and including battery means connected to alternatively receive or supply energy to said first and second storage means.

16. A variable voltage power supply according to claim 15 wherein said AC source comprises a sine wave generator, and said means for producing said first and second waveforms comprises a split rectifier.

17. A variable voltage power supply according to claim 16 wherein said reference source means further comprises phase lock means for locking the phase of said sine wave generator to that of said AC supply.

18. A variable voltage power supply according to claim 17 wherein said power source means comprises voltage regulator means coupled between said AC supply and said first and second energy storage means.

19. A variable voltage power supply according to claim 14 wherein said first energy storage means comprises first inductance means and first capacitance means, and said second energy storage means comprises second inductance means and second capacitance means.

20. A variable voltage power supply according to claim 19 including first and second transfer means, said first transfer means transferring energy stored by said first inductance means to said source means during off periods of said first switching means, and said second transfer means transferring energy stored by said second inductance means to said source means during off periods of said second switching means.

21. A variable voltage power supply according to claim 20 wherein said first transfer means comprises a first unidirectional conduction means connected between said first inductance means and said source means and adapted to conduct current only in response to a threshold voltage provided by a collapsing magnetic field in said first inductance means caused by opening of said first switching means, and a second unidirectional conduction means connected between said second inductance means and said source means and adapted to conduct current only in response to a threshold voltage provided by a collapsing magnetic field in said second inductance means caused by opening of said second switching means.

* * * * *